United States Patent
Mishra et al.

(10) Patent No.: US 8,144,537 B2
(45) Date of Patent: Mar. 27, 2012

(54) BALANCED SENSE AMPLIFIER FOR SINGLE ENDED BITLINE MEMORY ARCHITECTURE

(75) Inventors: Anand Kumar Mishra, Uttar Pradesh (IN); Harsh Rawat, Haryana (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 190 days.

(21) Appl. No.: 12/616,696

(22) Filed: Nov. 11, 2009

(65) Prior Publication Data

US 2010/0172199 A1    Jul. 8, 2010

(30) Foreign Application Priority Data

Nov. 11, 2008   (IN) .......................... 2558/DEL/2008

(51) Int. Cl.
*G11C 7/00* (2006.01)
*G11C 8/00* (2006.01)

(52) U.S. Cl. ........ 365/203; 365/205; 365/207; 365/208; 365/230.03

(58) Field of Classification Search .................. 365/203, 365/205, 207, 208, 230.03; 708/706; 714/5.11; 257/312

See application file for complete search history.

(56) References Cited

U.S. PATENT DOCUMENTS

| | | | | |
|---|---|---|---|---|
| 3,562,608 A * | 2/1971 | Gallagher et al. | ............ | 257/312 |
| 4,010,450 A * | 3/1977 | Porter et al. | .................. | 714/5.11 |
| 5,257,235 A * | 10/1993 | Miyamoto | ............... | 365/230.03 |
| 5,966,315 A * | 10/1999 | Muller et al. | .................. | 365/207 |
| 6,094,701 A * | 7/2000 | Mochizuki et al. | ...... | 365/230.03 |
| 6,462,998 B1 * | 10/2002 | Proebsting | ..................... | 365/205 |
| 6,504,778 B1 * | 1/2003 | Uekubo | ........................ | 365/207 |
| 6,678,198 B2 * | 1/2004 | Issa et al. | ..................... | 365/207 |
| 6,768,692 B2 * | 7/2004 | Luk et al. | ..................... | 365/205 |
| 7,325,024 B2 * | 1/2008 | Mathew et al. | ............... | 708/706 |
| 7,436,689 B2 * | 10/2008 | Fukushi | ................... | 365/230.03 |
| 7,656,731 B2 * | 2/2010 | Jung et al. | ..................... | 365/203 |

* cited by examiner

Primary Examiner — Trong Phan

(57) ABSTRACT

A balanced differential amplifier sense amplifier senses the voltage level in a selected single bit line memory cell. The output of the selected single bit-line memory cell is connected to one input of the balanced differential sense amplifier while the other input receives a reference voltage provided by a corresponding single bit-line memory cell from a complementary memory bank. A supporting voltage is added-to/subtracted-from the reference voltage by providing a "bump" or "dip" mechanism or by utilizing a charge-sharing structure, in order to compensate for the variation in the sensed bit-line voltage over the duration of the sensing interval as well as for the disparity in voltage level from cell to cell.

20 Claims, 7 Drawing Sheets

BALANCED SENSE AMPLIFIER FOR SINGLE ENDED BITLINE MEMORY ARCHITECTURE

CROSS-REFERENCE TO RELATED APPLICATIONS

The present application is related to Indian Provisional Patent Application No. 2558/Del/2008, filed Nov. 11, 2008, entitled "A BALANCED SENSE AMPLIFIER FOR SINGLE ENDED BITLINE MEMORY ARCHITECTURE". Indian Provisional Patent Application No. 2558/Del/2008 is assigned to the assignee of the present application and is hereby incorporated by reference into the present disclosure as if fully set forth herein. The present application hereby claims priority under 35 U.S.C. §119(a) to Indian Provisional Patent Application No. 2558/Del/2008.

TECHNICAL FIELD

The present disclosure relates to a memory system and more specifically to a balanced sense amplifier for use in single ended bit line memories like ROMs, SRAMs and DRAMs.

BACKGROUND

In memory integrated circuits such as ROMs, SRAMs and DRAMs, the data content of a particular memory cell is read by sensing the voltage of its bit-line. A sense amplifier "senses" the voltage level of the bit line by comparing and amplifying its difference with respect to a reference voltage. The reference voltage is generally obtained from the bit line from a second "unselected" memory bank in-order to provide a "balanced" environment. The amplified voltage difference provides binary information corresponding to the data stored in the accessed memory cell. One type of sense amplifier used in memories, is a single ended sense amplifier where one input of the sense amplifier is the bit line. In such cases the "single" bit line will discharge for one state of memory cell and will remain at its pre-charged state for the other state of the memory cell.

SUMMARY

In some embodiments, the present disclosure relates to a balanced differential sense amplifier. The balanced differential sense amplifier to senses the voltage level in a selected single bit-line memory cell while maintaining a balanced environment. The output of the selected single bit-line memory cell is connected to one input of the balanced differential sense amplifier while the other input receives a reference voltage provided by a corresponding single bit-line memory cell from a complementary memory bank. A supporting voltage is added-to/subtracted-from the reference voltage by providing a "bump" or "dip" mechanism or by utilizing a charge-sharing structure, in order to compensate for the variation in the sensed bit-line voltage over the duration of the sensing interval as well as for the disparity in voltage level from cell to cell. The arrangement is designed to avoid any disturbance in the electrical matching and balancing at the internal nodes of the differential sense amplifier.

According to an embodiment of the present disclosure, a system comprising, a single-ended bit line memory device, said memory device comprising: a balanced differential sense amplifier; a first input of said balanced differential sense amplifier coupled to a bit line of a selected memory bank; a second input of said balanced differential sense amplifier coupled to a corresponding single ended bit line from the unselected memory bank; a voltage adder/subtractor; and a coupler having a first terminal connected to said voltage adder/subtractor and the second terminal connected to the second input of the balanced differential sense amplifier.

According to another embodiment of the present disclosure, a single-ended bit line memory device comprising: a balanced differential sense amplifier; a first input of said balanced differential sense amplifier coupled to a bit line of a selected memory bank; a second input of said balanced differential sense amplifier coupled to a corresponding single ended bit line from the unselected memory bank; a voltage adder/subtractor; and a coupler having a first terminal connected to said voltage adder/subtractor and the second terminal connected to the second input of the balanced differential sense amplifier.

According to another embodiment of the present disclosure, A method for sensing the voltage level in a single ended bit line memory device, the method comprising: generating a voltage step whenever a bank is selected; and coupling said voltage step to the complementary node of a balanced sense amplifier receiving the sense bit from the selected memory cell.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

The embodiments of the present disclosure will be described in detail with reference to the accompanying drawings. However, the present disclosure is not limited to the embodiments and the embodiments described herein in the art of the present disclosure. The disclosure is described with reference to specific circuits, block diagrams, signals, etc. simply to provide a more thorough understanding of the disclosure.

There are two techniques in accordance to which a single ended bit line is "sensed". First by means of an "UNBALANCED SENSE AMPLIFIER", this is biased in one direction to give a specific output when bit line is not discharged.

Figure 1:
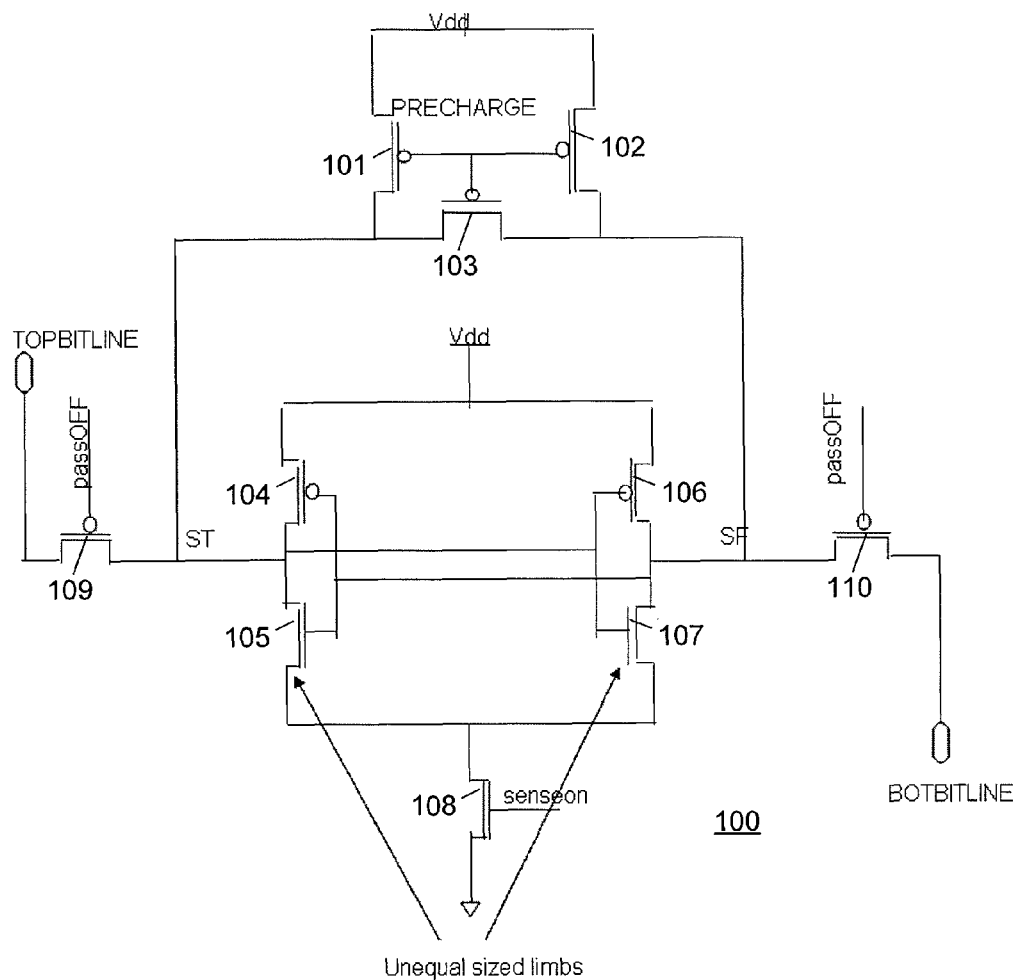
FIG. 1 illustrates a schematic diagram of a Device mismatch.
Figure 2:
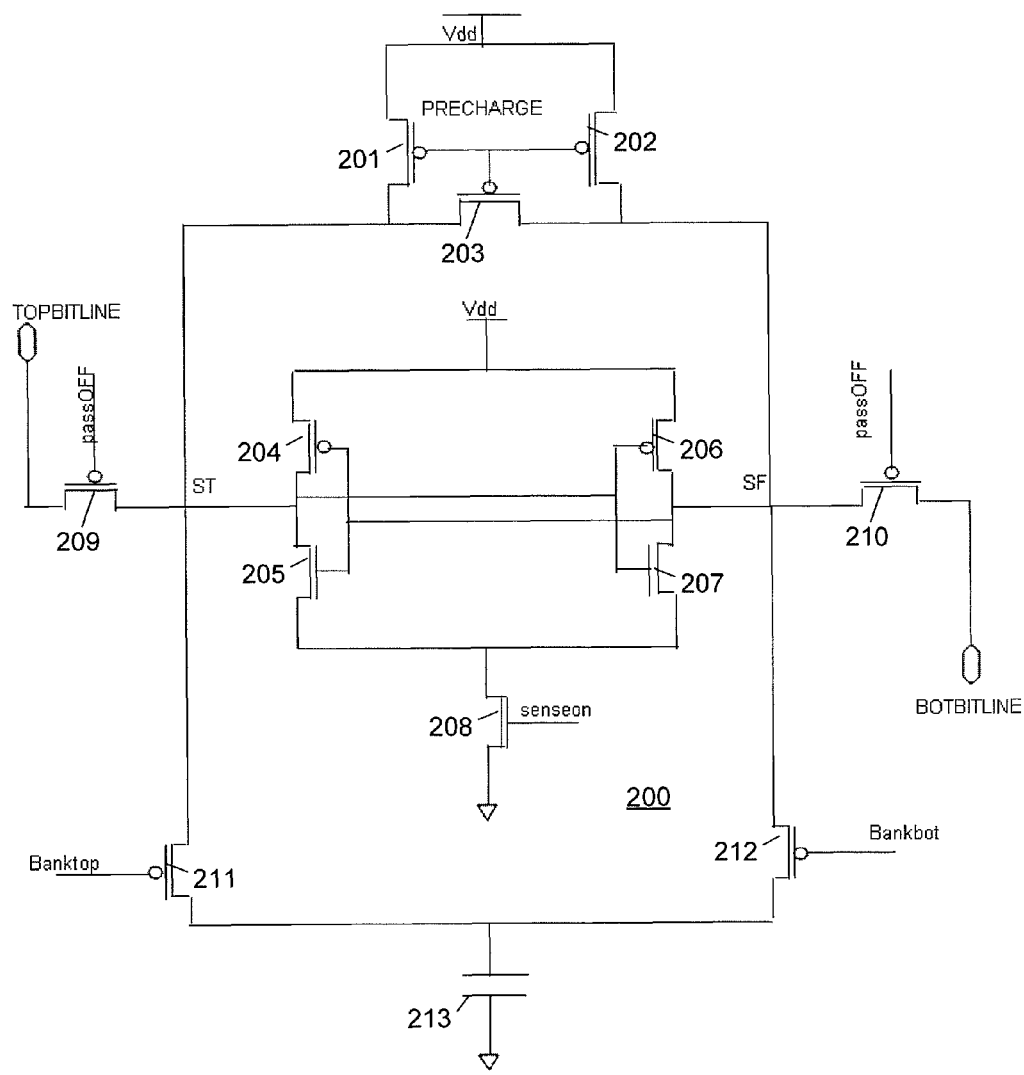
FIG. 2 illustrates a schematic diagram of a Capacitive mismatch.

The 'unbalance' is created by Device Mismatch as illustrated in FIG. 1 and a Capacitive Mismatch as illustrated in FIG. 2. But the use of an unbalanced sense amplifier to "sense" a single ended bit line makes it difficult to guarantee functionality at low voltages. This is because of huge inherent mismatch variations observed at low voltages leading to a huge margin requirement for Voltage difference at sense internal nodes which becomes unrealistic when the dimensions of the electronic circuit is shrinked further. Referring to FIG. 1, a device mismatch is created by making one limb of the device weaker as compared to the other limb, thereby making one node of sense amplifier to discharge faster than the other node. The device 100 includes a first, second and third p-channel transistors 101, 102 and 103, respectively each coupled at a gate thereof to a PRECHARGE signal. A first source/drain terminal of each of transistors 101 and 102 is connected to a power supply voltage Vdd, while the remaining source/drain terminal for those transistors 101 and 102 is each connected to a different one of the source/drain terminals for transistor 103.

One source/drain terminal of transistor 103 is connected to the common node ST coupled to a source/drain terminal of p-channel transistor 104 and a source/drain terminal of n-channel transistor 105, as well as to the gates of a p-channel transistor 106 and n-channel transistor 107. The other source/drain terminal of transistor 103 is connected to a common node SF coupled to a source/drain terminal of transistor 106 and a source/drain terminal of transistor 107, as well as to the gates of transistors 104 and 105. A source/drain terminal of each of transistors 104 and 106 is connected to the power supply voltage Vdd, and a source/drain terminal of each of transistors 105 and 107 is connected to a source/drain terminal of n-channel transistor 108. The other source/drain terminal of transistor 108 is connected to ground, and the gate receives a signal senseon. Nodes ST and SF are each connected to a source/drain terminal of one of p-channel transistors 109 and 110, respectively, with the other source/drain terminal of transistor 109 being connected to a signal TOPBITLINE and the other source/drain terminal of transistor 110 being connected to a signal BOTBITLINE. The gates of transistors 109 and 110 are both connected to a signal passOFF.

As noted above, transistors 105 and 107 in FIG. 1 are deliberately mismatched, having different channel lengths.

Referring to FIG. 2, a capacitive mismatch is created by putting an external capacitance on one node of the sense amplifier, thereby reducing its discharge rate as compared to the other node. The device 200 includes a first, second and third p-channel transistors 201, 202 and 203, respectively each coupled at a gate thereof to a PRECHARGE signal. A first source/drain terminal of each of transistors 201 and 202 is connected to a power supply voltage Vdd, while the remaining source/drain terminal for those transistors 201 and 202 is each connected to a different one of the source/drain terminals for transistor 203.

One source/drain terminal of transistor 203 is connected to the common node ST coupled to a source/drain terminal of p-channel transistor 204 and a source/drain terminal of n-channel transistor 205, as well as to the gates of a p-channel transistor 206 and n-channel transistor 207. The other source/drain terminal of transistor 203 is connected to a common node SF coupled to a source/drain terminal of transistor 206 and a source/drain terminal of transistor 207, as well as to the gates of transistors 204 and 205. A source/drain terminal of each of transistors 204 and 206 is connected to the power supply voltage Vdd, and a source/drain terminal of each of transistors 205 and 207 is connected to a source/drain terminal of n-channel transistor 208. The other source/drain terminal of transistor 208 is connected to ground, and the gate receives a signal senseon. Nodes ST and SF are each connected to a source/drain terminal of one of p-channel transistors 209 and 210, respectively, with the other source/drain terminal of transistor 209 being connected to a signal TOPBITLINE and the other source/drain terminal of transistor 210 being connected to a signal BOTBITLINE. The gates of transistors 209 and 210 are both connected to a signal passOFF.

Common node ST is connected to a source/drain terminal of p-channel transistor 211, which is connected at the gate to a signal Banktop. Common node SF is connected to a source/drain terminal of p-channel transistor 212, which is connected at the gate to a signal Bankbot. The remaining source/drain terminals of transistors 211 and 212 are connected to one terminal of a capacitor 213, which is connected at the opposite terminal to ground.

The second technique to sense a voltage difference in a single ended bit line is by using a "BALANCED SENSE AMPLIFIER" and creating a differential voltage between actual bit line and reference bit line. The differential voltage is created by discharging the reference bit line at slower rate than the actual bit line (either by reducing the turn-on current Ion of memory cell or by increasing the capacitance of reference bit line) or by allowing the reference bit line to discharge (with the same rate as actual bit line) after a definite time. Other technical features may be readily apparent to one skilled in the art from the following figures, descriptions and claims.

Figure 3:
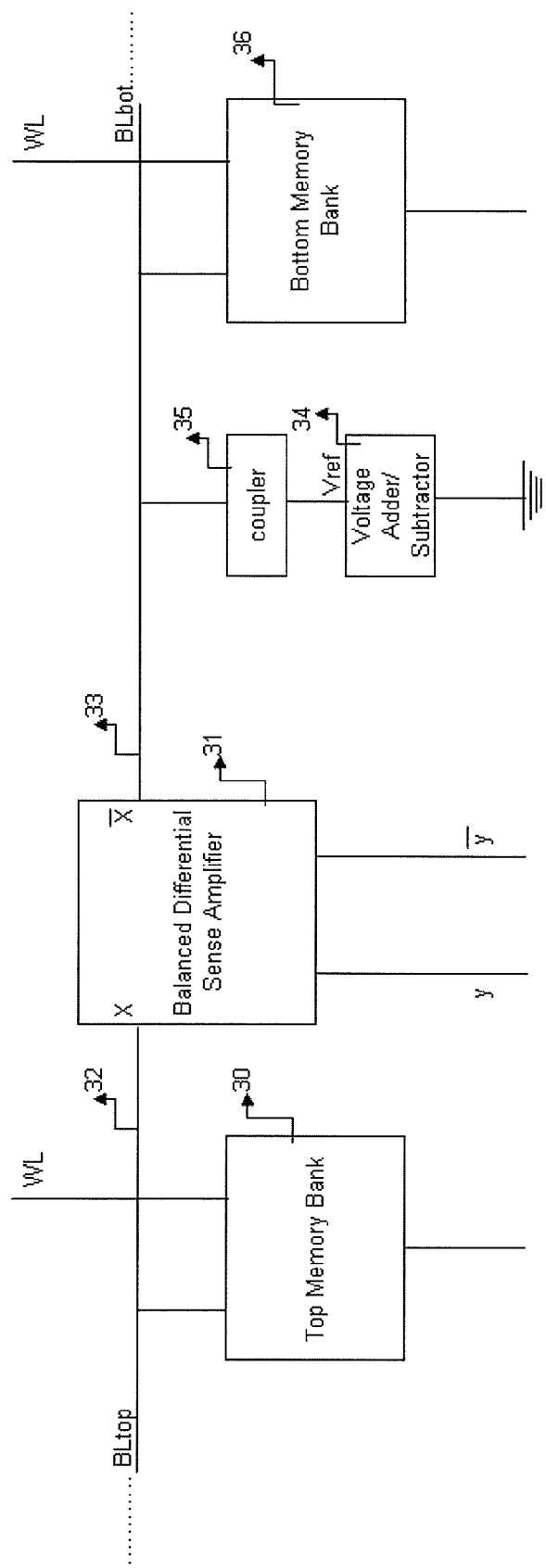
FIG. 3 describes a block diagram representation in accordance to an embodiment of the present disclosure.

FIG. 3 illustrates a block diagram representation in accordance to an embodiment of the present disclosure. It shows a balanced differential sense amplifier 31 with a single ended bit line BLtop of top memory bank 30 as one input 32 (X) and a single ended bit line BLbot of bottom memory bank 36 as the other input 33 (/X), where each memory bank 30 and 36 is connected to a word line WL and may be connected (at the bottom terminal) to additional circuits. A reference signal Vref is provided by a voltage adder/subtractor block 34 connected between ground and coupler 35 connected to the input 33. When the active clock goes high, a memory bank is selected depending upon the address signal at their input. Further, this bank select signal drives the voltage adder/subtractor 34. Accordingly, a positive or a negative voltage signal is generated which is coupled at the internal nodes of the balanced sense amplifier with a help of a coupler 35. Further, the voltage adder/subtractor block 34 works on the principle of charge sharing or charge balancing and creates a voltage difference at the internal nodes of the sense amplifier connected to outputs y and /y. This voltage difference compensates for the change in the voltage of the high state bit line and thus allows the sense amplifier to sense even at low voltages.

Figure 4:
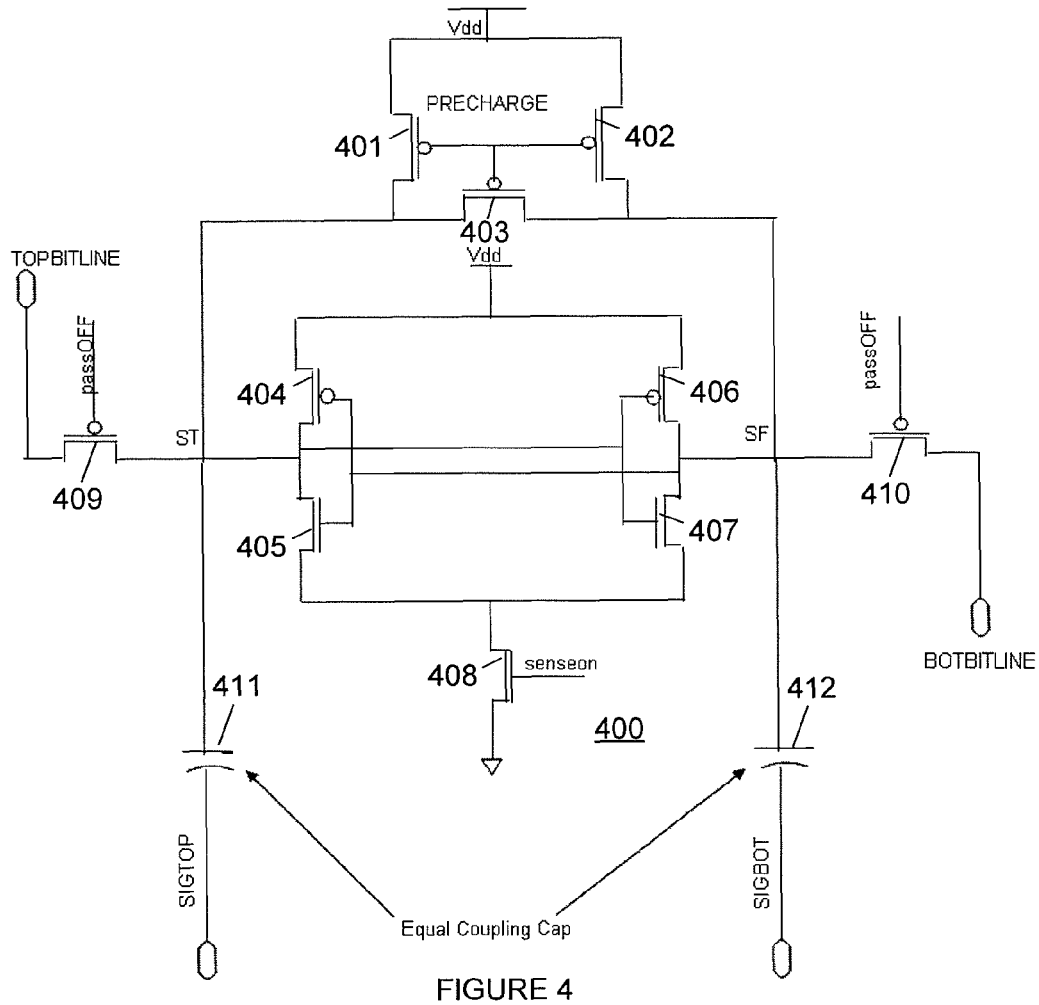
FIG. 4 illustrates circuit of a Balanced Sense Amplifier with equal coupling capacitors at its internal nodes in accordance to an embodiment of the present disclosure.

FIG. 4 illustrates circuit of a Balanced Differential Sense Amplifier with equal coupling capacitors at its internal nodes in accordance to an embodiment of the present disclosure. The device 400 includes a first, second and third p-channel transistors 401, 402 and 403, respectively each coupled at a gate thereof to a PRECHARGE signal. A first source/drain terminal of each of transistors 401 and 402 is connected to a power supply voltage Vdd, while the remaining source/drain terminal for those transistors 401 and 402 is each connected to a different one of the source/drain terminals for transistor 403.

One source/drain terminal of transistor 403 is connected to the common node ST coupled to a source/drain terminal of p-channel transistor 404 and a source/drain terminal of n-channel transistor 405, as well as to the gates of a p-channel transistor 406 and n-channel transistor 407. The other source/drain terminal of transistor 403 is connected to a common node SF coupled to a source/drain terminal of transistor 406 and a source/drain terminal of transistor 407, as well as to the gates of transistors 404 and 405. A source/drain terminal of each of transistors 404 and 406 is connected to the power supply voltage Vdd, and a source/drain terminal of each of transistors 405 and 407 is connected to a source/drain terminal of n-channel transistor 408. The other source/drain terminal of transistor 408 is connected to ground, and the gate receives a signal senseon. Nodes ST and SF are each connected to a source/drain terminal of one of p-channel transistors 409 and 410, respectively, with the other source/drain terminal of transistor 409 being connected to a signal TOPBITLINE and the other source/drain terminal of transistor 410 being connected to a signal BOTBITLINE. The gates of transistors 409 and 410 are both connected to a signal passOFF.

Common node ST is connected to one terminal of a coupling capacitor 411, the other terminal of which is connected to a signal SIGTOP. Common node SF is connected to one terminal of a coupling capacitor 412, the other terminal of which is connected to a signal SIGBOT. The two coupling capacitors 411, 412 are of equal size and act as couplers for the internal nodes ST and SF of the sense amplifier. One plate of the capacitor is coupled to internal nodes of the sense amplifier and the other plate is driven by two signals SIGTOP and SIGBOT. The signals SIGTOP and SIGBOT are coming from the memory banks TOP or BOTTOM. These signals SIGTOP and SIGBOT enable the selected bank of a memory when they transit from logic 1 to logic 0. For example, when the top bank is selected the signal SIGBOT makes a transition from 1 to 0 and lowers the voltage of the corresponding internal node, further approximated by ratio of the coupling capacitance to the total capacitance of the internal node. In the case when both the lines are at logic 1, the lowered voltage at the corresponding internal nodes creates a voltage difference at the internal nodes of the sense amplifier. The Sense-Amplifier then behaves as a conventional "BALANCED SENSE-AMPLIFIER". Thereafter, the internal node opposite to the actual bit line falls and correct read 1 is detected at the output. In case of read 0, the actual bit line discharges to a level where even after the bump is provided by coupling capacitor, the voltage level of actual node is below the reference internal node. Thus, the achieved voltage level maintains the functionality of the sense amplifier even at low voltages. Accordingly an improved robustness is realized in the integrated memory circuits.

Further, as another embodiment of the present disclosure the charge balancing mechanism is also realized with a negative "bump" or "dip" on the reference bit line with a slight change in voltage/adder subtractor logic. This system also facilitates in case of over drive with positive bump.

Figure 5:
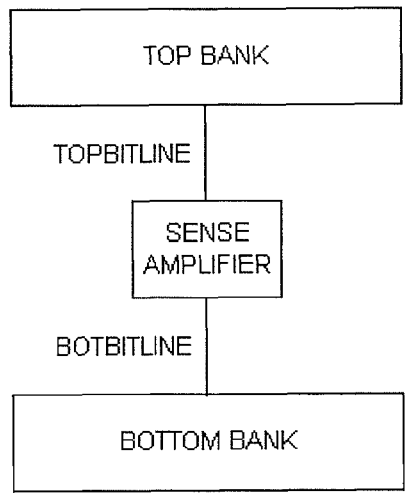
FIG. 5 illustrates memory banks accessed with the sense amplifier in accordance to an embodiment of the disclosure.

FIG. 5 illustrates memory banks accessed with the sense amplifier in accordance to an embodiment of the disclosure. The memory banks are arranged in two blocks named TOP & BOTTOM. The sense amplifier and other logical circuits are shared between these blocks. Depending on address signal at the input of the memory banks, a memory bank is selected. If the top memory bank is selected then the sense amplifier receives a high signal from the top bank (TOPBITLINE) which acts as a "Selected Bit Line" and a low signal from the Bottom bank (BOTBITLINE) which acts as a reference signal.

Figure 6:
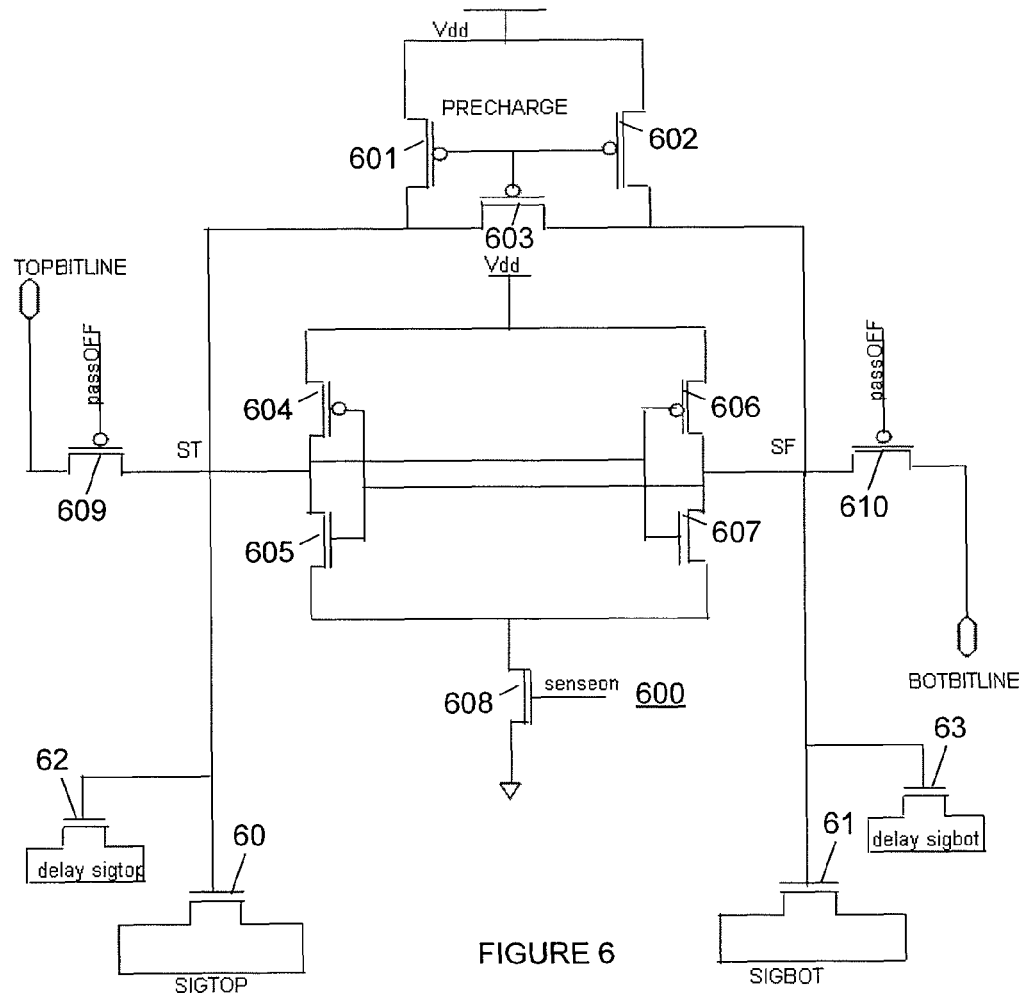
FIG. 6 illustrates implement of another embodiment of the present disclosure with NMOS device Capacitances.

FIG. 6 illustrates another aspect of the present disclosure which describes replacement of the coupling capacitors by the device capacitance 60 and 61 of the electronic device fabricated therein. The device 600 includes a first, second and third p-channel transistors 601, 602 and 603, respectively each coupled at a gate thereof to a PRECHARGE signal. A first source/drain terminal of each of transistors 601 and 602 is connected to a power supply voltage Vdd, while the remaining source/drain terminal for those transistors 601 and 602 is each connected to a different one of the source/drain terminals for transistor 603.

One source/drain terminal of transistor 603 is connected to the common node ST coupled to a source/drain terminal of p-channel transistor 604 and a source/drain terminal of n-channel transistor 605, as well as to the gates of a p-channel transistor 606 and n-channel transistor 607. The other source/drain terminal of transistor 603 is connected to a common node SF coupled to a source/drain terminal of transistor 606 and a source/drain terminal of transistor 607, as well as to the gates of transistors 604 and 605. A source/drain terminal of each of transistors 604 and 606 is connected to the power supply voltage Vdd, and a source/drain terminal of each of transistors 605 and 607 is connected to a source/drain terminal of n-channel transistor 608. The other source/drain terminal of transistor 608 is connected to ground, and the gate receives a signal senseon. Nodes ST and SF are each connected to a source/drain terminal of one of p-channel transistors 609 and 610, respectively, with the other source/drain terminal of transistor 609 being connected to a signal TOPBITLINE and the other source/drain terminal of transistor 610 being connected to a signal BOTBITLINE. The gates of transistors 609 and 610 are both connected to a signal passOFF.

Common node ST is connected to the gates of n-channel transistors 60 and 62, the source/drain terminals of which are tied together and for transistor 60 connected to the signal SIGTOP and for transistor 62 connected to a signal delay_sigtop. Common node SF is connected to the gates of n-channel transistors 61 and 63, the source/drain terminals of which are tied together and for transistor 61 connected to the signal SIGBOT and for transistor 63 connected to a signal delay_sigbot. The gate capacitance of the electronic devices 60-63 is used for charge transfer at the internal nodes of the sense amplifier. This reduces the variations as the device capacitance is stable as compared to IONs at low voltage. The electronic device as a capacitance is either a diode, an NMOS device (as shown in FIG. 6), a PMOS device, a poly to n-well device, or any other capacitive device. According to another embodiment of the disclosure, source and drain capacitances of the device are used to serve as device capacitance.

According to the present embodiment of the disclosure, the electronic device is an NMOS device.

Figure 7:
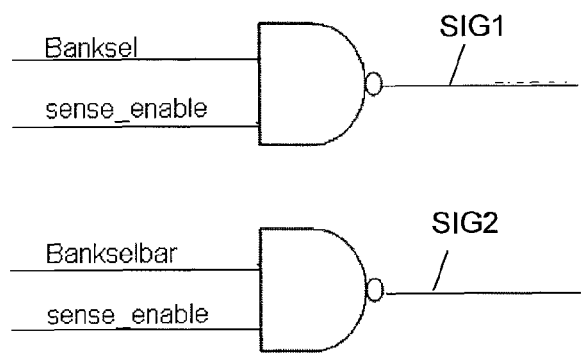
FIG. 7 illustrates a voltage adder/subtractor in accordance to an embodiment of the disclosure.

FIG. 7 along with the FIG. 6 illustrates the working principle of the device capacitance architecture according to the present disclosure. The signals SIGTOP and SIGBOT are driven through SIG1 and SIG2 signals. The signal SIG1 is generated in combination with Banksel and sense_enable signal inverted by the NAND gate. The Banksel signal corresponds to the TOP bank which an address pin is determining when top bank is active; SIG1 also corresponds to TOP bank and the signal Bankselbar corresponds to bottom bank. Similarly, the signal SIG2 is generated in combination with the signals Bankselbar and sense_enable inverted by a NAND gate making the signal SIG2 a complement of the signal SIG1. In the FIG. 7, the signal sense_enable is at Vdd level and the signals Banksel/Bankselbar are the address signals. These signals are setup before sense amplifier's precharge is off. If Banksel signal is at ground and Bankselbar signal is at Vdd, it implies that the signal SIGBOT is at Vdd and the signal SIGTOP is at ground. When the sense_enable signal, which is active low, goes low there is a toggling on SIGTOP but not on SIGBOT. As shown in FIG. 6, the signal SIGBOT transfers the charge to the internal node ST through coupling capacitance which raises the voltage of the corresponding internal node thus creating the voltage difference at the internal nodes of the sense amplifier and the Sense-Amplifier behaves as a conventional "BALANCED SENSE-AMPLIFIER". Thereafter, the internal node opposite to actual bit line falls and correct read 1 is detected at the output. As for read 0, the actual bit line is required to discharge to a level such that even after a "bump" is provided by coupling capacitance; the voltage level achieved maintains the functionality of the sense amplifier even at low voltages. In case of using negative bump when top bank is selected SIGBOT signal will be toggled from VDD to GND, hence coupling and creating a dip on the reference side thus creating a voltage difference for correct sensing.

As shown in FIG. 6 capacitors 62 and 63 are added in parallel as delaysigtop and delaysigbot which in normal operations are driven by Vdd. If there is a failure of read 1, then the capacitors 62 and 63 provide a means to drive these signals to SIGTOP and SIGBOT respectively and thus there is an increase in read 1 margin. Hence, read 1 signal losses at silicon level are recovered. Modes for increasing read 0 margins are provided by delaying the sense_enable signal through self timing.

Figure 8:
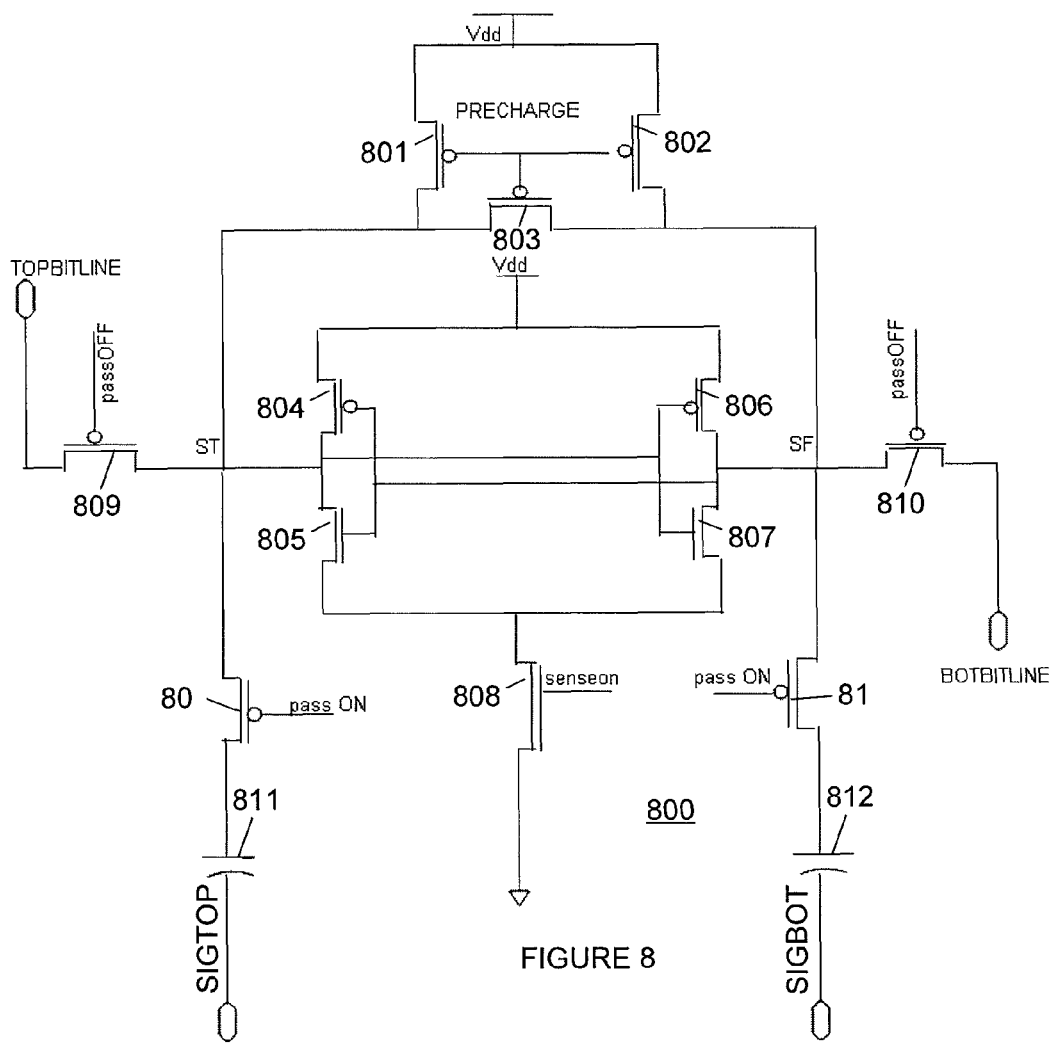
FIG. 8 illustrates a charge sharing mechanism in accordance to an embodiment of the disclosure.

FIG. 8 illustrates a charge sharing mechanism according to another aspect of the present disclosure. The scheme is implemented with capacitors connected through a pass gate 80 and 81 which are PMOS FET transistors placed at the internal nodes of the balanced sense amplifier. The device 800 includes a first, second and third p-channel transistors 801, 802 and 803, respectively each coupled at a gate thereof to a PRECHARGE signal. A first source/drain terminal of each of transistors 801 and 802 is connected to a power supply voltage Vdd, while the remaining source/drain terminal for those transistors 801 and 802 is each connected to a different one of the source/drain terminals for transistor 803.

One source/drain terminal of transistor 803 is connected to the common node ST coupled to a source/drain terminal of p-channel transistor 804 and a source/drain terminal of n-channel transistor 805, as well as to the gates of a p-channel transistor 806 and n-channel transistor 807. The other source/drain terminal of transistor 803 is connected to a common node SF coupled to a source/drain terminal of transistor 806 and a source/drain terminal of transistor 807, as well as to the gates of transistors 804 and 805. A source/drain terminal of each of transistors 804 and 806 is connected to the power supply voltage Vdd, and a source/drain terminal of each of transistors 805 and 807 is connected to a source/drain terminal of n-channel transistor 808. The other source/drain terminal of transistor 808 is connected to ground, and the gate receives a signal senseon. Nodes ST and SF are each connected to a source/drain terminal of one of p-channel transistors 809 and 810, respectively, with the other source/drain terminal of transistor 809 being connected to a signal TOPBITLINE and the other source/drain terminal of transistor 810 being connected to a signal BOTBITLINE. The gates of transistors 809 and 810 are both connected to a signal passOFF.

Common node ST is connected to one source/drain terminal of a p-channel transistor 80. The other source/drain terminal of transistor 80 is connected to one terminal of a coupling capacitor 811, the other terminal of which is connected to a signal SIGTOP. Common node SF is connected to one source/drain terminal of a p-channel transistor 81. The other source/drain terminal of transistor 81 is connected to one terminal of a coupling capacitor 812, the other terminal of which is connected to a signal SIGBOT. The main function is to share the charge at internal nodes connected to reference bit line with pre-sized capacitances with signals SIGTOP and SIGBOT of equal value. So, when the top bank is selected then SIGBOT signal is maintained at GND level before passON signal goes low while the signal SIGTOP remains at VDD and when the passON signal goes low the signal SIGBOT shares charge with corresponding internal node and thus creates a dip on the nodes resulting in the required voltage difference. But, when the selected bit line does not discharge, a read 1 level is observed at nodes and in case of read 0 the selected bit line should discharge enough so that even after the dip created, sense resolves in correct direction.

In another embodiment of the disclosure, the capacitors shown in FIG. 8 are realized by using Device capacitance and these capacitance values are very stable as compared to turn-on current ION. These devices can be NMOS, PMOS or a poly to nwell.

Figure 9:
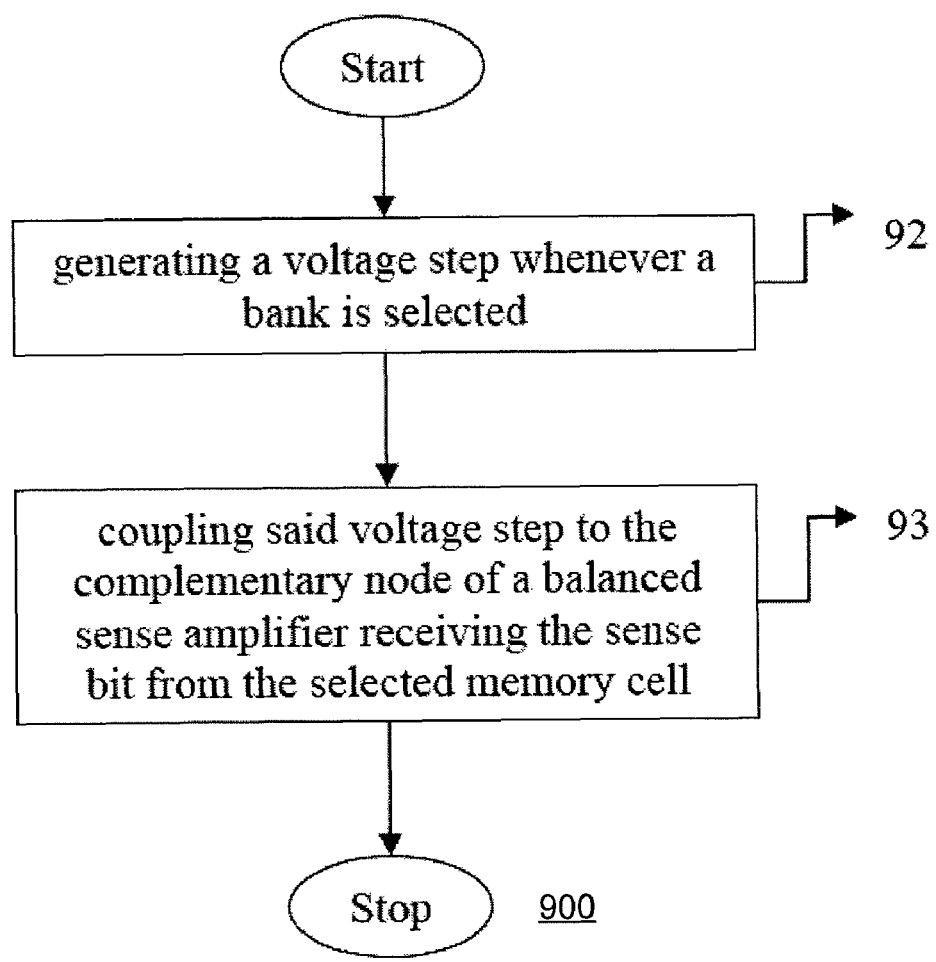
FIG. 9 illustrates a flow chart for a method for sensing a single ended bit line in the memory architecture.
Figure 4:
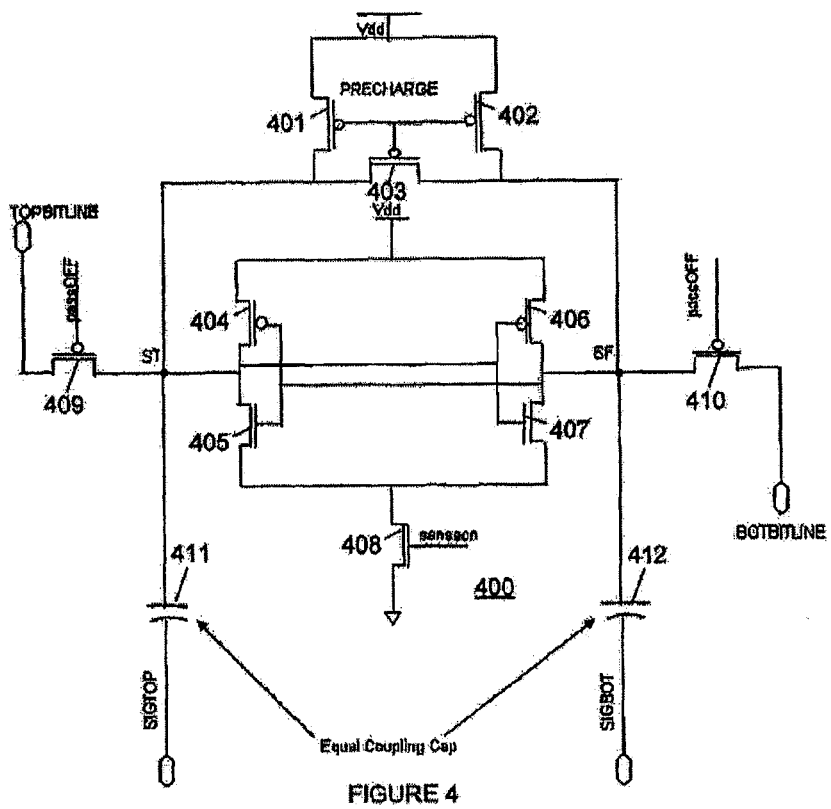
Figure 6:
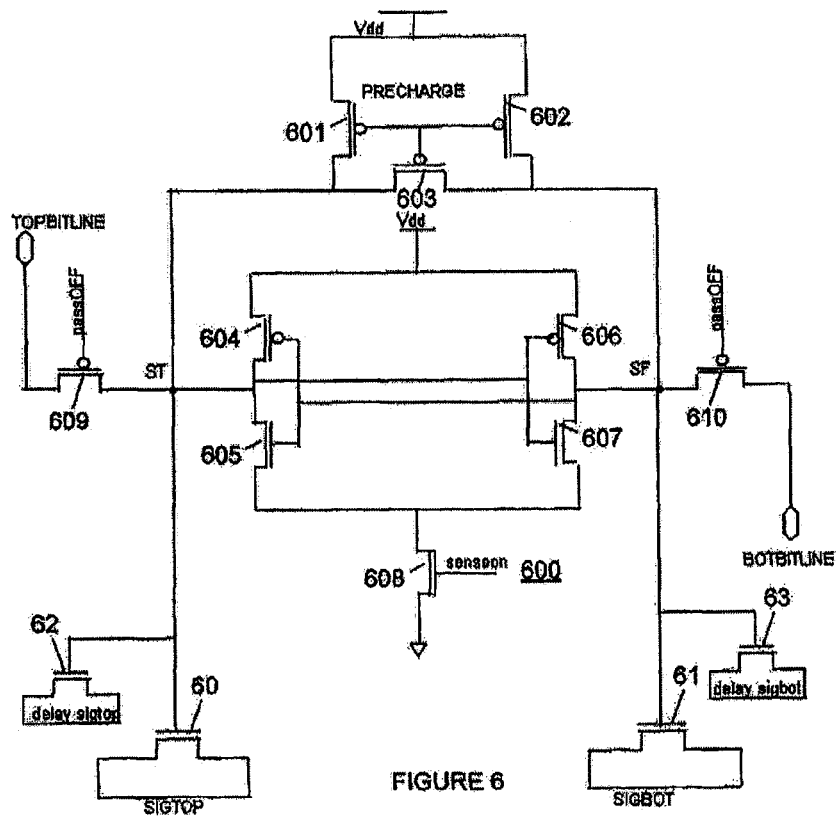

FIG. 9 illustrates a flowchart for a method 900 for sensing a single ended bit line in the memory architecture. In step 92 a supporting voltage is generated whenever a bank is selected in the memory architecture. Further, this voltage is coupled (in step 93) by a coupler 35 to the complementary node of a balanced sense differential amplifier receiving the sense bit from the selected memory cell.

The embodiment of the present disclosure can be used in various applications of single ended bitline memories like ROMs, SRAMs and DRAMs.

Embodiments of the method for sensing the single ended bit line memory architecture are described in FIG. 9. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

Although the disclosure of the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A memory device comprising:
a balanced differential sense amplifier;
a first input of the balanced differential sense amplifier coupled to a first single-ended bit line of a selected memory bank;
a second input of the balanced differential sense amplifier coupled to a second single-ended bit line from an unselected memory bank;
a first voltage adder/subtractor coupled to a first bank select signal and the first input of the balanced differential sense amplifier; and
a said second voltage adder/subtractor coupled to a second bank select signal and the second input of the balanced differential sense amplifier.

2. The system as claimed in claim 1, wherein the first and second voltage adders/subtractors are each a capacitor.

3. The system as claimed in claim 1, wherein the first and second voltage adders/subtractors are each a device capacitance of a MOS device.

4. The system as claimed in claim 1, wherein the first and second voltage adders/subtractors are each is a device capacitance of a poly to n-well device.

5. The system as claimed in claim 1, further comprising:
logic gate configured to provide an active level change to one of the first and second inputs when the selected memory bank is selected.

6. The system as claimed in claim 1, further comprising:
a first pass gate configured to selectively connect the first voltage adder/subtractor to the first input; and
a second pass gate configured to selectively connect the second voltage adder/subtractor to the second input.

7. The system as claimed in claim 6, wherein the first and second pass gates are each an MOS switch.

8. A memory device, comprising:
a first memory bank;
a second memory bank;
a balanced differential sense amplifier coupled between the first and second memory banks;
a first input of the balanced differential sense amplifier coupled to a first single-ended bit line of a selected one of the first and second memory banks;
a second input of the balanced differential sense amplifier coupled to a second single ended bit line from an unselected one of the first and second memory banks;
a first voltage adder/subtractor configured to connect a first signal derived from a bank select signal to the first input of the balanced differential sense amplifier; and
a second voltage adder/subtractor configured to connect a second signal derived from an inversion of the bank select signal to the second input of the balanced differential sense amplifier,
wherein the selection of one of the first and second memory banks produces an active level change at one of the first and second inputs.

9. The memory device as claimed in claim 8, wherein the first and second voltage adders/subtractors each comprise a capacitance.

10. The memory device as claimed in claim 9, wherein the capacitance is a device capacitance of an MOS device.

11. The memory device as claimed in claim 10, wherein the device capacitance is a gate capacitance of a poly to n-well device.

12. The memory device as claimed in claim 8, further comprising:
a logic configured to provide, in response to the bank select signal, an active level change to on one of the first and second signals when the selected memory bank is selected.

13. The memory device as claimed in claim 8, is further comprising:
a first pass gate configured to selectively connect the first voltage adder/subtractor to the first input; and
a second pass gate configured to selectively connect the second voltage adder/subtractor to the second input.

14. The memory device as claimed in claim 8, wherein the first and second voltage adders/subtractors each comprise a first capacitance device and a second device capacitance.

15. A method, comprising:
generating an active level change on one of first and second signal lines for a balanced differential sense amplifier coupled between first and second memory banks whenever one of the first and second memory banks is selected; and
coupling the active level change to a node within a balanced differential sense amplifier that corresponds to a memory cell within the selected one of the first and second memory banks.

16. The method as claimed in claim 15, wherein a voltage differential within the balanced differential sense amplifier is generated by a charge sharing mechanism operating on internal sensing nodes of the balanced differential sense amplifier in response to a single-ended bank select signal.

17. The method as claimed in claim 15, further comprising:
providing the active level change to a coupler when the selected one of the first and second memory banks is selected, the coupler adding or subtracting a voltage to the node.

18. The method as claimed in claim 17, wherein the coupler comprises a pass gate.

19. The method as claimed in claim 17, wherein the coupler comprises a capacitor capacitance.

20. The method as claimed in claim 17, wherein the capacitance is a device capacitance of a MOS device.

* * * * *

UNITED STATES PATENT AND TRADEMARK OFFICE
CERTIFICATE OF CORRECTION

| | | |
|---|---|---|
| PATENT NO. | : 8,144,537 B2 | Page 1 of 3 |
| APPLICATION NO. | : 12/616696 | |
| DATED | : March 27, 2012 | |
| INVENTOR(S) | : Anand Kumar Mishra and Harsh Rawat | |

It is certified that error appears in the above-identified patent and that said Letters Patent is hereby corrected as shown below:

Replace Figures 2, 4, 6 and 8 with the following as shown on the attached pages:

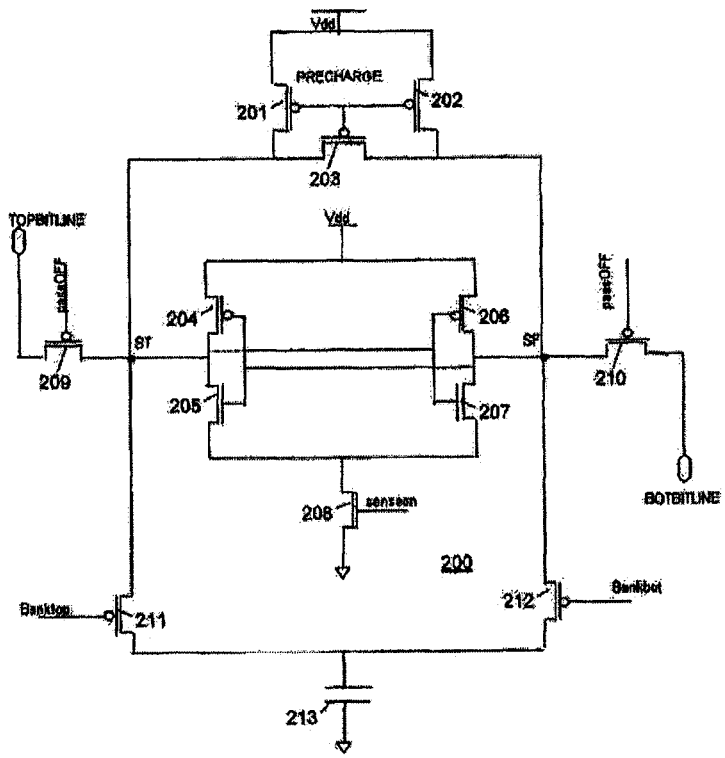

FIGURE 2

Signed and Sealed this
Eighth Day of May, 2012

David J. Kappos
*Director of the United States Patent and Trademark Office*

CERTIFICATE OF CORRECTION (continued)
U.S. Pat. No. 8,144,537 B2

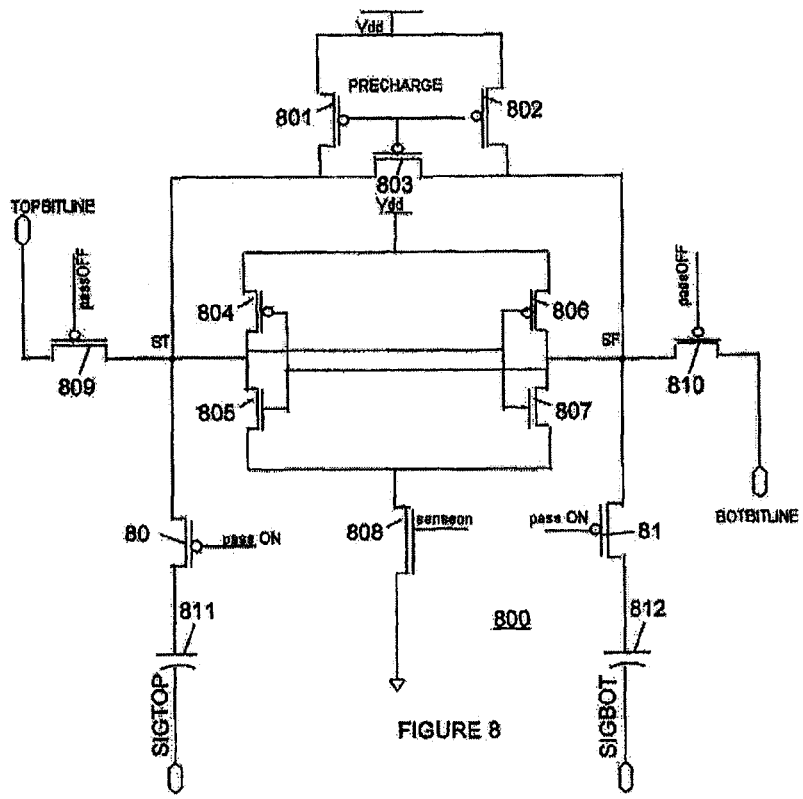

FIGURE 8

At column 4, line 25 replace "Ion" with -- ION --,

At column 6, lines 61-62, delete "making the signal SIG2 a complement of the signal SIG1", At column 7, line 2, replace "SIGBOT" with -- SIGTOP --,